United States Patent [19]
Edwards

[11]  3,943,440
[45]  Mar. 9, 1976

[54] SENSITIVITY CODING CIRCUIT FOR AN ELECTRONIC INSTRUMENT
[75] Inventor: Allen P. Edwards, Palo Alto, Calif.
[73] Assignee: Hewlett-Packard Company, Palo Alto, Calif.
[22] Filed: Oct. 3, 1974
[21] Appl. No.: 511,908

[52] U.S. Cl.................................. 324/95; 324/115
[51] Int. Cl.² ................... G01R 21/04; G01R 15/08
[58] Field of Search............................ 324/95, 115

[56] References Cited
UNITED STATES PATENTS
3,133,278    5/1964    Mills ................................. 324/115
3,464,012    8/1969    Webb................................. 324/115

Primary Examiner—R. V. Rolinec
Assistant Examiner—Ernest F. Karlsen
Attorney, Agent, or Firm—Patrick J. Barrett

[57]   ABSTRACT

A power meter having a remote power transducer is provided with a circuit for measuring the value of a resistor in the transducer to indicate and automatically adjust the power measuring circuitry for the sensitivity of the transducer used.

5 Claims, 3 Drawing Figures

3,943,440

SENSITIVITY CODING CIRCUIT FOR AN ELECTRONIC INSTRUMENT

BACKGROUND AND SUMMARY OF THE INVENTION

Power meters are frequently used for measuring signal strength at microwave frequencies since the power level of a signal along a lossless transmission line will remain constant, while the current and the voltage components of the signal vary periodically with distance. For convenience in making measurements, the transducer which absorbs the signal to be measured is usually remote from the actual metering circuitry and is connected to the metering circuitry by a flexible cable. The sensitivity of power transducers commonly used with microwave power meters usually varies from unit to unit; and, thus, most power meters provide a front panel adjustment for setting the sensitivity of the metering circuitry to correspond with the sensitivity of the transducer being used in order to achieve calibrated readings. In addition, some power meters can be used with transducers covering different ranges, requiring a change in the meter scale factor when the transducer is changed.

To facilitate the use of transducers with various sensitivities, some power meters have provided coding circuits within the transducer. These coding circuits are connected to the power metering circuitry with a plurality of wires in the cable between the transducer and the power meter to adjust the sensitivity of the metering circuitry according to the code wired into the transducer as well as appropriately adjusting the display. Such display adjustments may comprise lighting different meter scales or adding a constant to a digital display. While this particular system increases operator convenience it is disadvantageous because it increases the cost and bulk of the transducer and cable assembly and requires more expensive connectors due to the increased number of wires and connector pins.

According to a preferred embodiment of the present invention a power transducer is provided with a coding resistor which is connected to the power metering circuit by a single wire. A current is driven through this resistor via the wire, using the gound conductor already present in the cable as a return path for the current. The voltage across the resistor is measured and coded in binary form by an analog-to-digital (A/D) converter circuit for adjusting the sensitivity of the metering circuit. The A/D converter uses a series of feed-forward comparators in which the output of a previous comparator is used to adjust the reference level against which the voltage across the resistor is compared. Since the A/D converter is static and free-running, it does not require a clock or elaborate chains of feedback comparators, thus reducing the cost and complexity of the system.

DESCRIPTION OF THE PREFERRED EMBODIMENT

Figure 1:
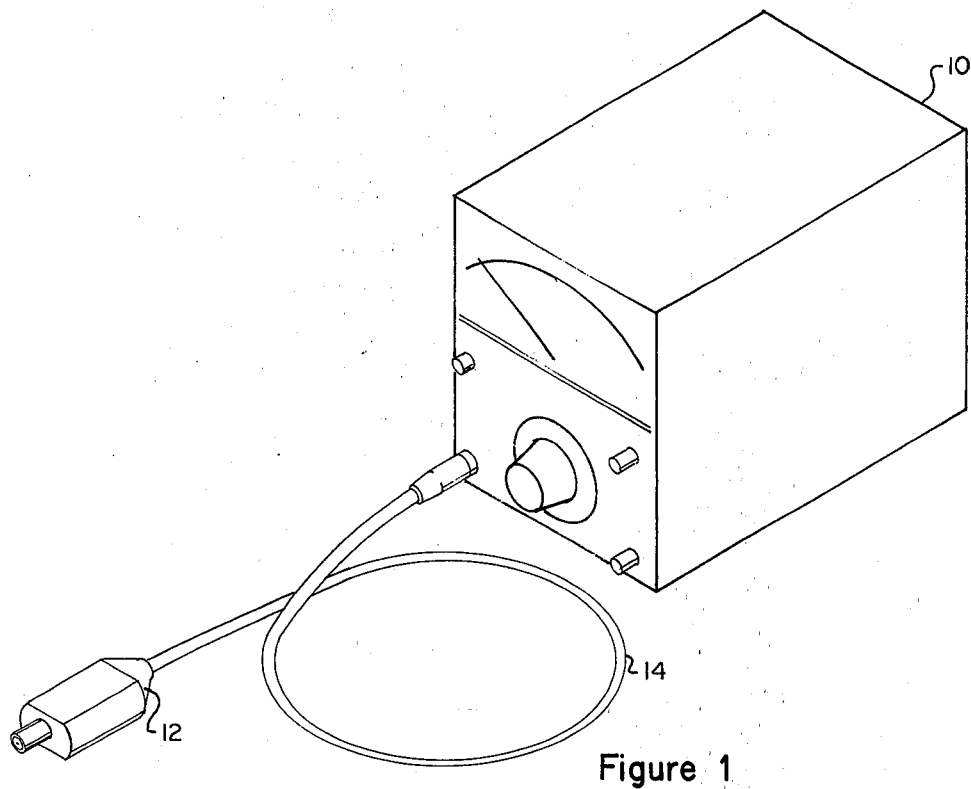
FIG. 1 shows a power meter connected to a power transducer via a cable.

FIG. 1 shows a power meter 10 connected to a transducer 12 via a cable 14. Typical microwave power meter transducers are thermocouples or thermistors which are configured as matched terminations for the transmission line carrying the signal to be measured. Some transducers also include signal conditioning circuitry such as a preamplifier. Signals from the transducer representing the power absorbed are carried via the cable to the metering circuitry in power meter 10, and the cable may also carry various bias and supply signals for circuitry in transducer 12. The meter in power meter 10 will give a calibrated indication of the power absorbed by the transducer when the controls on the power meter are set appropriately.

As previously mentioned, power meters usually provide a means for adjusting the sensitivity of the metering circuitry to allow for variations in sensitivity from one transducer to the next. Such adjustments are necessary if the meter is to give a calibrated indication of the absolute level of the power measured and the meter operator must be careful to set the sensitivity adjustment correctly to avoid erroneous measurements. The preferred embodiment disclosed in the following paragraphs eliminates the inconvenience of having to set a sensitivity adjustment by providing means in the transducer and the power meter to automatically adjust the power meter sensitivity to correspond to the sensitivity of the transducer.

Figure 2:
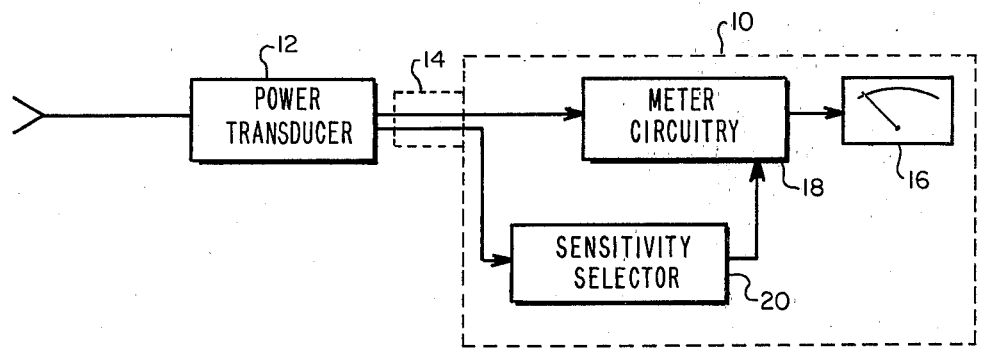
FIG. 2 shows a block diagram of a preferred embodiment of the present invention.

FIG. 2 shows a block diagram of a power measuring apparatus including a power transducer 12 connected by a cable 14 to a power meter 10 that includes a meter 16, meter circuitry 18 and a sensitivity selector circuit 20. The sensitivity selector circuit 20 detects the value of a coding resistor in power transducer 12 and generates a digital signal to adjust the sensitivity of the meter circuitry accordingly. Such an adjustment, for example, might comprise adjusting the gain of an amplifier, activating a light to illuminate one of a plurality of scales on meter 16, adding or subtracting a numerical constant from a digital display or changing an indicator showing the units being measured. For example, a change from a high sensitivity to a lower sensitivity transducer might require a change in scale from microwatts to milliwatts. Since power transducers and various forms of power metering circuitry are well known in the art, they will not be further discussed here.

Figure 3:
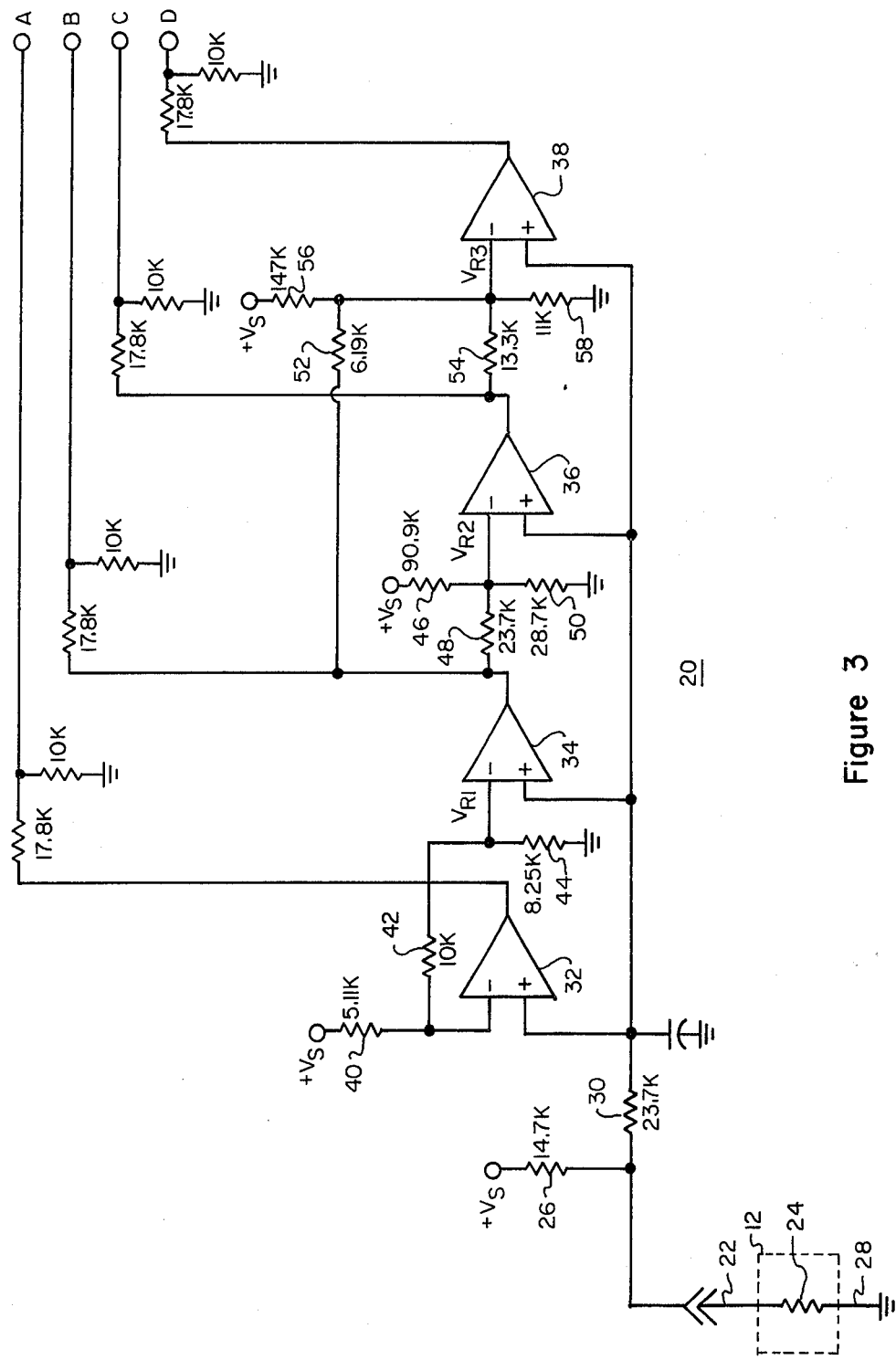
FIG. 3 shows a schematic diagram of the analog-to-digital converter of the present invention.

FIG. 3 shows sensitivity selector circuitry 20 connected via a wire 22 and cable 14 to a resistor 24 in the power transducer. A current is driven through coding resistor 24 by resistor 26 connected to the DC power source $V_s$, which may be 15 volts, for example. A return path for the current is provided by connecting the coding resistor to a convenient ground 28, such as a ground conductor in cable 14. Coding resistor 24 is connected to the A/D converter by input resistor 30.

The A/D converter comprises 4 comparators 32, 34, 36, and 38. The positive or noninverting input of each comparator is connected to coding resistor 24 via input resistor 30 and cable 14. The negative or inverting input of each comparator is connected to a reference voltage source.

The reference voltage for comparator 32 is provided by a voltage divider comprising resistors, 40, 42 and 44 where the reference point is between resistors 40 and 42. The voltage at the inverting input of comparator 32 is selected so that the output of this comparator will be low, approximately 0 volts, whenever a coding resistor is present. The output will be high, e.g. about 13 volts (when a 15 volt power source is used) if a coding resistor is not present. Thus comparator 32 provides a go/no go signal that tells whether a coding resistor is actually present in the circuit.

The reference voltage for comparator 34 is provided by the voltage divider comprising resistors 40, 42 and 44, however the reference point for this comparator is between resistors 42 and 44. The voltage at this point, $V_{R1}$, is approximately half the voltage, V, that is developed across the highest valued coding resistor. Thus the output of comparator 34 tells whether the value of the coding resistor in the circuit is greater or lesser than one half the greatest value of coding resistor, i.e. the median value, thus providing one binary digit of information.

The reference voltage, $V_{R2}$, for comparator 36 can have one of two values depending upon the output of comparator 34. When the output of comparator 34 is low the reference voltage is V/4 since current from resistor 46, connected to power supply $V_s$, flows through parallel resistors 48 and 50. When the output of comparator 34 is high the voltage at the inverting input of comparator 36 is 3/4 V since the reference voltage is now developed across resistor 50 which is supplied with current by both resistors 46 and 48.

The reference voltage for comparator 38 can have any one of four different values since the inverting input of comparator 38 is connected to the outputs of both comparators 34 and 36 through resistors 52 and 54. The relationship of the various reference voltages, comparator outputs and coding resistor values for each of the comparators are shown in Table I below:

TABLE I

| Resistor 24 | $V_{R1}$ | $V_{R2}$ | $V_{R3}$ | A | B | C | D |
|---|---|---|---|---|---|---|---|
| 0 ohms | V/2 | V/4 | V/8 | 0 | 0 | 0 | 0 |
| 1.62 KΩ | " | " | " | 0 | 0 | 0 | 1 |
| 3.48 KΩ | " | " | 3V/8 | 0 | 0 | 1 | 0 |
| 6.19 KΩ | " | " | " | 0 | 0 | 1 | 1 |
| 10.0 KΩ | " | 3V/4 | 5V/8 | 0 | 1 | 0 | 0 |
| 14.7 KΩ | " | " | " | 0 | 1 | 0 | 1 |
| 21.5 KΩ | " | " | 7V/8 | 0 | 1 | 1 | 0 |
| 34.8 KΩ | " | " | " | 0 | 1 | 1 | 1 |
| open | " | " | " | 1 | 1 | 1 | 1 |

Each of the digital outputs A, B, C and D are connected to the comparator outputs via a voltage divider which is used to scale the output voltage to the proper level for use by standard 5 volt logic circuitry. Thus when the output of a comparator is 0 volts the digital output will be a logical low, i.e. approximately 0 volts. Likewise when the output of a comparator is high the digital output will be a logical high, i.e. about 4½ volts. It will be understood, however, that other logic levels can be used. In order to provide the maximum amount of noise immunity in the circuit, the values of the coding resistors have been picked so that the voltage developed across each one will fall half way between the reference voltage points that correspond to that particular resistance value. This resistor selection helps reduce the probability that noise induced on cable 14 will give an erroneous sensitivity reading.

The digital outputs are connected to the meter circuitry, as illustrated in FIG. 2, to adjust the sensitivity of that circuit or the scale of the display through the binary code shown in Table I. Circuitry for utilizing such binary codes is well known in the art and will thus not be discussed in detail here. It will also be appreciated that, while eight different sensitivities are provided for through the use of three stages in the A/D converter, a different number of sensitivities could be accomodated through the use of more or fewer stages.

I claim:

1. A transducer sensitivity coding circuit for an electronic instrument having measurement circuits and a remote transducer unit connected to the electronic instrument by a cable, the electronic instrument employing different transducers for different measurement ranges, the transducer sensitivity coding circuit automatically providing information to the electronic instrument of the transducer sensitivity comprising:
a fixed value resistor mounted in the transducer unit having a value indicative of the sensitivity of a particular transducer unit;
a current supply circuit in the electronic instrument connected to the cable for supplying a current to the resistor to develop a resistor voltage across the resistor; and
comparator means in the electronic instrument, connected to the cable and the measurement circuits, for comparing the resistor voltage with a plurality of reference voltages for producing a signal indicative of the value of the resistor in the transducer unit to adjust the sensitivity of the measurement circuits.

2. A transducer sensitivity coding circuit as in claim 1 wherein the comparator means comprises:
a first reference voltage supply;
a first comparator having a first input connected to the resistor via the cable, having a second input connected to the first reference voltage supply, and having an output, for comparing the resistor voltage with the first reference voltage for giving a first output signal when the resistor voltage is greater than the first reference voltage and a second output signal when the resistor voltage is less than the first reference voltage;
a second reference voltage supply connected to the output of the first comparator for supplying a second reference voltage which has a first value in response to the first comparator first output signal and a second value in response to the first comparator second output signal; and
a second comparator having a first input connected to the resistor via the cable, having a second input connected to the second reference voltage supply, and having an output, for comparing the resistor voltage with the second reference voltage for giving a first output signal when the resistor voltage is greater than the second reference voltage and a second output signal when the resistor voltage is less than the second reference voltage.

3. A transducer sensitivity coding circuit as in claim 2 wherein the comparator means further comprises:
a third reference voltage supply connected to the outputs of the first and second comparators for supplying a third reference voltage which has a first value in response to the first comparator first output signal and the second comparator first output signal, a second value in response to the first comparator first output signal and the second comparator second output signal, a third value in response to the first comparator second output signal and the second comparator first output signal, and a fourth value in response to the first comparator second output signal and the second comparator second output signal; and a third comparator having a first input connected to the resistor via the cable, having a second input connected to the third reference voltage supply, and having an output, for comparing the resistor voltage with the third reference voltage for giving a first output signal when the resistor voltage is greater than the third reference voltage and a second output signal when the resistor voltage is less than the third reference voltage.

4. A transducer sensitivity coding circuit as in claim 3 wherein the comparator means further comprises a fourth comparator having an input connected to the cable and having an output connected to the measurement circuits for producing a signal to indicate whether the resistor is connected to the cable.

5. A transducer sensitivity coding circuit as in claim 3 wherein:

the voltage that can be developed by the current supply circuit across a resistor having the highest of the plurality of values is $V$;

the first reference voltage is $V/2$;

the first value of the second reference voltage is $V/4$ and the second value of the second reference voltage is $3V/4$; and the first value of the third reference voltage is $V/8$, the second value of the third reference voltage is $3V/8$, the third value of the third reference is $5V/8$ and the fourth value of the third reference is $7V/8$.

* * * * *